United States Patent
Greiser et al.

(10) Patent No.: US 10,768,254 B2
(45) Date of Patent: Sep. 8, 2020

(54) METHOD AND MAGNETIC RESONANCE IMAGING APPARATUS FOR PROVIDING A PLANNING ENVIRONMENT FOR MAGNETIC RESONANCE IMAGING

(71) Applicant: Siemens Healthcare GmbH, Erlangen (DE)

(72) Inventors: Andreas Greiser, Erlangen (DE); Daniel Nico Splitthoff, Erlangen (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 470 days.

(21) Appl. No.: 15/616,980

(22) Filed: Jun. 8, 2017

(65) Prior Publication Data

US 2017/0356975 A1    Dec. 14, 2017

(30) Foreign Application Priority Data

Jun. 8, 2016    (DE) .......... 10 2016 210 068

(51) Int. Cl.
*G01R 33/54*    (2006.01)
*G01R 33/36*    (2006.01)
*G01R 33/56*    (2006.01)
*G01R 33/58*    (2006.01)

(52) U.S. Cl.
CPC ....... *G01R 33/543* (2013.01); *G01R 33/3607* (2013.01); *G01R 33/546* (2013.01); *G01R 33/5608* (2013.01); *G01R 33/58* (2013.01)

(58) Field of Classification Search
CPC ............. G01R 33/543; G01R 33/546; G01R 33/3607; G01R 33/5608; G01R 33/58
See application file for complete search history.

(56) References Cited

U.S. PATENT DOCUMENTS

| | | | |
|---|---|---|---|
| 6,414,486 B1 | 7/2002 | Koellner et al. | |
| 2014/0037169 A1* | 2/2014 | Fenchel | A61B 5/0035 382/131 |
| 2015/0042333 A1* | 2/2015 | Grodzki | G01R 33/543 324/309 |
| 2015/0355304 A1* | 12/2015 | Kurokawa | A61B 5/055 324/309 |
| 2015/0362567 A1 | 12/2015 | Martin et al. | |

* cited by examiner

*Primary Examiner* — Patrick Assouad
*Assistant Examiner* — Haidong Zhang
(74) *Attorney, Agent, or Firm* — Schiff Hardin LLP

(57) ABSTRACT

In a magnetic resonance imaging apparatus and a method for the operation thereof, a diagnostic magnetic resonance imaging sequence is selected in a control computer of the apparatus, and an adjustment parameter for the selected sequence is acquired in the control computer, which is specific to the subject under examination. A limit value for a loading parameter of the subject is specified in the computer, and a parameter range for an imaging parameter of the sequence is determined in the computer on the basis of the acquired adjustment parameter and the specified limit value for the loading parameter. A planning environment for the magnetic resonance imaging of the subject is presented, in which only the determined parameter range can be set for the imaging parameter.

20 Claims, 3 Drawing Sheets

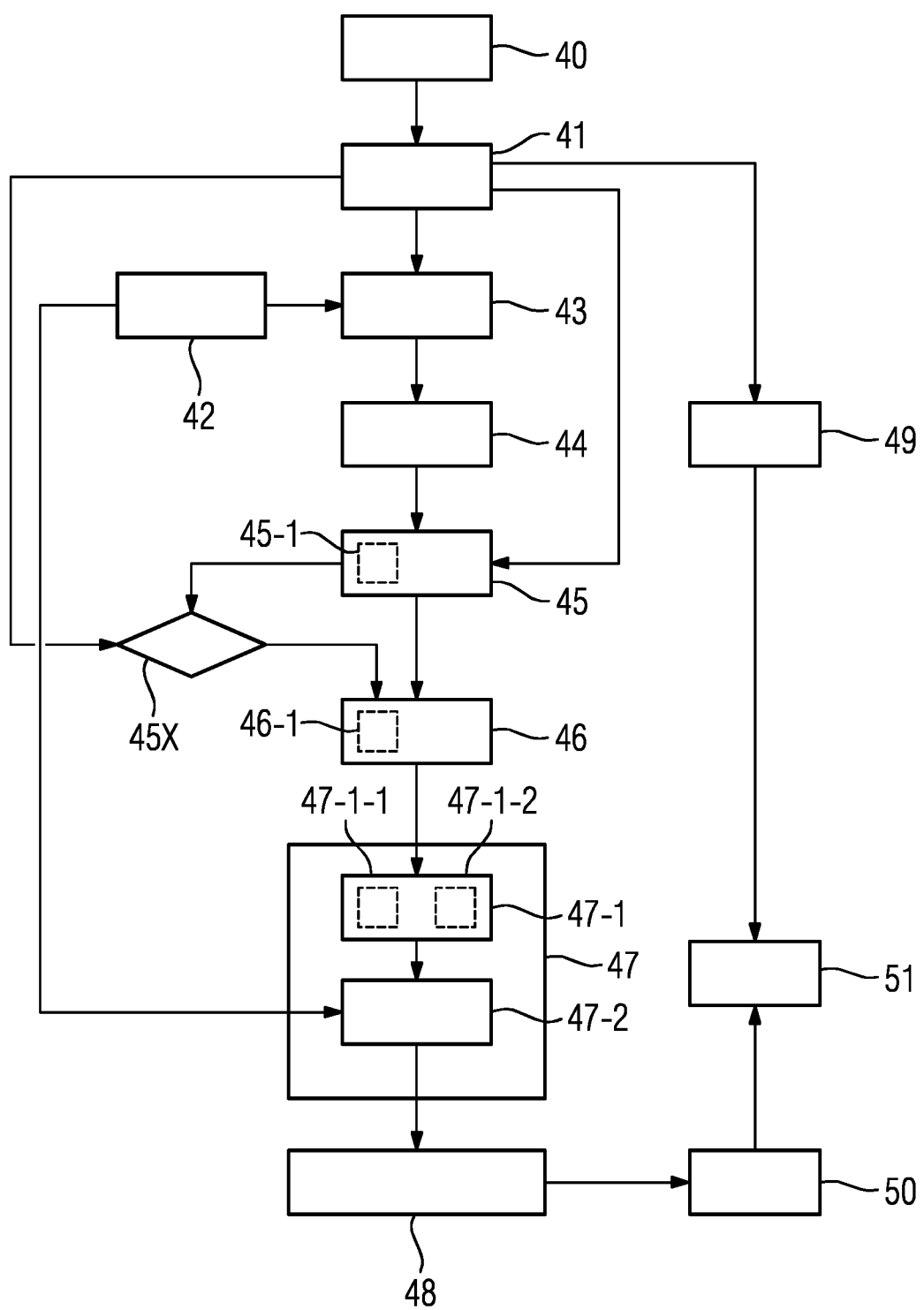

METHOD AND MAGNETIC RESONANCE IMAGING APPARATUS FOR PROVIDING A PLANNING ENVIRONMENT FOR MAGNETIC RESONANCE IMAGING

BACKGROUND OF THE INVENTION

Field of the Invention

The invention concerns a method for providing a planning environment for magnetic resonance imaging, as well as a magnetic resonance imaging apparatus, and a non-transitory, computer-readable data storage medium encoded with programming instructions, for implementing such a method.

Description of the Prior Art

In the scanner of a magnetic resonance imaging (MRI) apparatus, a basic field magnet is normally used to apply a relatively high main magnetic field, for example of 1.5 or 3 or 7 Tesla, to the body of a subject under examination, for instance a patient, a healthy subject, an animal or a phantom, which is to be examined. In addition, a gradient coil arrangement is used to activate gradient switching operations. RF pulses, for instance excitation pulses, are then emitted by an RF antenna unit using a suitable antenna, causing the nuclear spins of certain atoms, which have been excited to resonance by these RF pulses, to be tipped by a defined flip angle with respect to the magnetic field lines of the basic magnetic field. RF signals, known as magnetic resonance signals, are emitted when the nuclear spins relax. These signals are received by suitable RF antennas and then processed further. The desired image data are reconstructed from the raw data acquired in this manner.

A specific magnetic resonance sequence, also known as a pulse sequence, must be emitted by the scanner for a particular measurement. Such a sequence is composed of a succession of RF pulses, for instance excitation pulses and refocusing pulses, and gradient switching operations, which must be emitted in a coordinated manner to fit the RF pulse sequence, along different gradient axes in different spatial directions. Readout windows, which are set at times to fit this sequence, define the time intervals in which the induced magnetic resonance signals are acquired.

An adjustment measurement is usually performed before starting the diagnostic magnetic resonance imaging in order to ensure patient safety and high image quality. The adjustment measurement can ensure that the nuclear spins inside the body of the subject under examination are tipped by the required flip angle during the magnetic resonance imaging. It is also possible to use the results of the adjustment measurement to predict a distribution of a loading parameter, for example a specific absorption rate (SAR), in the body of the subject under examination. The adjustment measurement can be used in this way to prevent a limit value for the loading parameter from being exceeded, so that it is possible, for instance, to prevent burns to the subject under examination during the magnetic resonance imaging.

The adjustment measurement is usually performed at least once before the start of the diagnostic magnetic resonance imaging using the actual magnetic resonance sequence. If the region under examination does not change during the diagnostic magnetic resonance imaging, then the results of this adjustment measurement can be re-used for the entire magnetic resonance imaging process of the subject under examination. The adjustment measurement is typically started when a user clicks on "Apply" or "Start" on a screen at the operating console, after configuring the magnetic resonance sequence.

SUMMARY OF THE INVENTION

An object of the invention is to facilitate improved provision of a planning environment for magnetic resonance imaging.

The method according to the invention for providing a planning environment for magnetic resonance imaging of a subject under examination by a magnetic resonance imaging device has the following method steps.

A magnetic resonance sequence for diagnostic magnetic resonance imaging of a subject under examination is selected in a control computer of the MRI apparatus.

An adjustment parameters for the selected magnetic resonance sequence is acquired, which is specific to the subject under examination.

A limit value for a loading parameter of the subject under examination is specified in the control computer.

A parameter range for an imaging parameter of the magnetic resonance sequence is determined by the control computer on the basis of the acquired adjustment parameter and the specified limit value for the loading parameter.

A planning environment for the magnetic resonance imaging of the subject under examination is presented by the control computer via a user interface, which only the determined parameter range can be set for the imaging parameter.

A user can select the magnetic resonance sequence via the interface. The magnetic resonance sequence can also be set by a selected examination protocol. Selecting the magnetic resonance sequence can also involve setting a default configuration of imaging parameters for the magnetic resonance sequence.

The adjustment parameter, which is specific to the subject under examination, can be acquired in an adjustment measurement. The adjustment measurement is performed when the subject under examination is positioned for the diagnostic magnetic resonance imaging in the scanner. If the adjustment measurement is performed before the diagnostic magnetic resonance sequence is selected, for instance during a localizer measurement, then the adjustment parameter, which is acquired in the adjustment measurement, can be stored in a database. The adjustment parameter can then be loaded from the database immediately after the magnetic resonance sequence is selected. Selecting the magnetic resonance sequence and/or opening an imaging protocol containing the magnetic resonance sequence then advantageously initiates the loading of the adjustment parameter from the database. Alternatively, the adjustment measurement can take place after the diagnostic magnetic resonance sequence is selected, particularly if a suitable adjustment parameter for the selected magnetic resonance sequence does not yet exist. The adjustment measurement then advantageously starts immediately in time after the diagnostic magnetic resonance sequence is selected and/or after the imaging protocol containing the diagnostic magnetic resonance sequence is opened. Selecting the diagnostic magnetic resonance sequence then initiates the start of the adjustment measurement, in which the adjustment parameter is acquired. In this case, the adjustment measurement advantageously starts automatically without further user interaction when the diagnostic magnetic resonance sequence is selected. These alternatives apply likewise to other adjustment measurements described below.

The adjustment parameter acquired in the adjustment measurement is specific to the subject under examination in the sense that it allows safe magnetic resonance imaging of the subject under examination using the selected magnetic resonance sequence, which produces an adequate image quality. In the adjustment measurement, a proportion of different tissue types in the subject under examination can be determined, such as a proportion of muscle tissue or fat tissue, with the adjustment parameter then being based on the proportion of the different tissue types. Alternatively or additionally, in the adjustment measurement the weight of the subject under examination can be acquired, such as by being entered into the control computer, with the adjustment parameter then being based on the weight of the subject under examination. The adjustment parameter can define a maximum or mean amplitude (known as the B1 amplitude) of RF pulses employed during the magnetic resonance imaging using the diagnostic magnetic resonance sequence. In this case, the adjustment parameter can define maximum or mean RF voltages or energizations of an RF coil of the magnetic resonance scanner that is designed for radiating the RF pulses. Alternatively or additionally, the adjustment parameter can define maximum or mean RF powers of an RF amplifier. The adjustment parameter can be an estimate of a loading parameter expected for the magnetic resonance imaging of the subject under examination using the selected diagnostic magnetic resonance sequence. More than one adjustment parameter can be acquired. Thus, acquiring the adjustment parameter can be acquiring an adjustment parameter set. These alternatives apply likewise to other adjustment parameters described below, and to other adjustment measurements described below.

The method according to the invention can include the intermediate step of checking whether the selected magnetic resonance sequence using its default settings for the diagnostic imaging parameter already exceeds limits. If this is the case, changes to the magnetic resonance sequence and/or to the settings for the imaging parameter of the magnetic resonance sequence can be made already at this stage automatically. For instance, gradient switching operations on physical axes of the magnetic resonance sequence can be analyzed for at least a representative portion of the magnetic resonance sequence. This analysis can establish whether a maximum slew rate of the gradient switching operations and/or a maximum amplitude of the gradient switching operations and/or of a stimulation of the subject under examination is exceeded by the gradient switching operations. Since these values are typically not specific to the subject under examination, this analysis need not necessarily draw on results from the adjustment measurement.

The loading parameter, in particular a determined value of the loading parameter, can characterize, for example, heating and/or stimulation of the subject under examination during the diagnostic magnetic resonance imaging. The loading parameter can also characterize a probability of an active implant implanted in the subject under examination being heated and/or malfunctioning during the magnetic resonance imaging. Loading of the subject under examination by absorption of electromagnetic fields, known as the Specific Absorption Rate loading (SAR loading), can be considered as a possible loading parameter. A magnetic field variation over time acting on the subject under examination, what is known as the T/s rate, can be considered as another possible loading parameter.

The limit value for the loading parameter must not be exceeded during the diagnostic magnetic resonance imaging. The limit value for the loading parameters is specific to the subject under examination and can be calculated from information available on the subject under examination. The limit value for the loading parameter defines an upper limit of a range for the loading parameter, in which range the subject under examination can be examined safely during the magnetic resonance imaging. It is also possible that the limit value for the loading parameter must not be exceeded only at a specific position inside the body of the subject under examination during the magnetic resonance imaging. The limit value for the loading parameter can be defined directly during registration of the subject under examination and/or when the magnetic resonance sequence is selected prior to planning the magnetic resonance imaging. Possible limit values are, for instance, a maximum occurring SAR loading and/or a maximum occurring T/s rate.

Imaging parameters include, for example, certain basic settings for the magnetic resonance sequence used for the magnetic resonance imaging. Thus the imaging parameter can specify a flip angle, a repetition time, a time length of a pause between measurements or segments of the magnetic resonance sequence, a slice thickness, a slice spacing, a number of slices, a resolution, an echo time, a number of averages, etc. Further imaging parameters considered practical by those skilled in the art are also possible of course. It is also possible to determine a number of parameter ranges for different imaging parameters of the magnetic resonance sequence.

Since RF pulses and/or gradient switching operations of the magnetic resonance sequence are set on the basis of the imaging parameter, a loading parameter executed during the magnetic resonance imaging depends in particular on the setting for the imaging parameter of the magnetic resonance sequence. Thus determining the parameter range for the imaging parameter can include identifying an effect of the imaging parameter on the loading parameter. The parameter range is determined by an algorithm, which uses the adjustment parameter and the specified limit value for the loading parameter as input parameters, and for which the parameter range is an output parameter. The parameter range for the imaging parameter includes those values of the imaging parameter for which magnetic resonance imaging is possible within the limit value for the loading parameter. The parameter range for the imaging parameter thus can be referred to as the permitted parameter range or as the configurable parameter range. Determining the parameter range is based on the acquired adjustment parameter, which is acquired in the adjustment measurement. Of course this procedure can also be extended to parameter combinations of a number of imaging parameters, so that only parameter combinations determined on the basis of the limit value of the loading parameter are allowed for the diagnostic magnetic resonance imaging. These considerations apply likewise to other parameter ranges.

The parameter range for the imaging parameter can be determined, for example, by calculating a number of values of the loading parameter that are expected for the diagnostic magnetic resonance imaging on the basis of a number of values of the imaging parameter and of the adjustment parameter. The number of expected values of the loading parameter can then be compared with the limit value of the loading parameter, this comparison checking whether the expected values of the loading parameter exceed the limit value of the loading parameter. If this is the case, then the values of the imaging parameter that are associated with the critical values of the loading parameter are excluded from the allowed parameter range for the imaging parameter.

The planning environment for the magnetic resonance imaging is a presentation format at the user interface. The planning environment is used by an operator for setting the imaging parameter of the diagnostic magnetic resonance sequence, namely a value thereof. Allowing only the parameter range for the imaging parameter thus occurs already at the stage of planning the diagnostic magnetic resonance imaging or configuring the magnetic resonance sequence for the diagnostic magnetic resonance imaging. Selecting values of the imaging parameter for the magnetic resonance imaging that lie outside the parameter range are prohibited in the planning environment, so that these values of the imaging parameter are unavailable to the operator. For example, such values of the imaging parameter that cannot be selected can be hidden and/or grayed-out and/or given a color background (for instance red) in the planning environment. Those alternatives apply likewise to other planning environments described below.

The diagnostic magnetic resonance imaging of the subject under examination can finally be performed on the basis of the planning of the magnetic resonance imaging, in particular on the basis of the setting for the imaging parameter inside the parameter range using the planning environment. Magnetic resonance measurement data from the subject under examination then can be obtained during the diagnostic magnetic resonance imaging. Magnetic resonance image data can be reconstructed from the magnetic resonance measurement data and then be provided as an electronic output for display and/or storage.

The inventive provision of the planning environment advantageously prevents the user setting the imaging parameter outside the limits of the parameter range. Thus even at the stage of planning the magnetic resonance imaging using the planning environment, it can be guaranteed that the limit value for the loading parameter is not infringed during the magnetic resonance imaging. The user thus is prevented from configuring the diagnostic magnetic resonance sequence in such a way that the loading parameter is exceeded during the magnetic resonance imaging using the configured magnetic resonance sequence. The safety of the subject under examination during the magnetic resonance imaging thus can be guaranteed even during the planning process, by the planning environment. This is made possible by a prediction of the loading of the subject under examination being made by the planning environment already at the stage of configuring the diagnostic magnetic resonance sequence.

It is also possible for the user to be notified only that the loading parameter is exceeded after planning of the diagnostic magnetic resonance sequence is finished. In conventional procedures, the user is typically informed of such overshoots of the loading parameter, in particular of a maximum SAR loading, only at the end of planning, together with suggestions for changes to the magnetic resonance sequence in order to comply with the limit value of the loading parameter. Conventional notifications of this kind about the loading parameter being exceeded are often implemented as pop-ups, for instance SAR pop-ups, on the user interface of the planning environment. It is particularly advantageous to use the inventive procedure to prevent these pop-ups in the first place. This is because the pop-ups can irritate the user, and therefore preventing the pop-ups can increase user-friendliness. In addition, blind acceptance of the suggestions in the pop-ups can result in a sub-optimal configuration of the magnetic resonance sequence and hence to lower-quality imaging results because the implications of the suggested changes are often unclear, especially for less well-trained users. With the inventive procedure, the user can set the imaging parameter appropriately within the parameter range so that a high image quality of the magnetic resonance image data acquired during the magnetic resonance imaging can be guaranteed by the user.

According to an embodiment, the adjustment parameter is acquired by an adjustment measurement, which starts automatically and immediately in time after the diagnostic magnetic resonance sequence is selected. The adjustment measurement therefore starts without a time delay directly after selection of the magnetic resonance sequence, in particular directly after selection of the magnetic resonance sequence by the user. Selecting the magnetic resonance sequence therefore can immediately initiate the start of the adjustment measurement. This means the start of the adjustment measurement is not initiated only after a user actuates a start button for the magnetic resonance sequence after configuration of the magnetic resonance sequence. Thus the adjustment measurement is started already before the user has finished planning the magnetic resonance sequence. The adjustment parameter, which is acquired in the adjustment measurement, thus can be available for adapting the planning environment already at the stage of planning the magnetic resonance sequence. The planning environment can then be provided at the end of the adjustment measurement on the basis of the adjustment parameter, which is acquired in the adjustment measurement.

In another embodiment, the adjustment measurement is a transmit adjustment, which involves setting an RF voltage in an RF coil designed for transmission (radiation). In the transmit adjustment, a particularly advantageous adjustment parameter can be determined for determining the parameter range.

In an embodiment, the adjustment measurement requires a time of less than five seconds, preferably less than four seconds, more preferably less than three seconds, and most preferably a maximum time of two seconds. The short duration of the adjustment measurement is particularly advantageous for reducing a possible time delay between selecting the diagnostic magnetic resonance sequence, which initiates the start of the adjustment measurement, and providing and/or adapting the first planning environment on the basis of the adjustment parameter, which is acquired in the adjustment measurement. This can increase user-friendliness. In addition, waiting times during planning of the magnetic resonance sequence can be reduced for the user.

In another embodiment, determining the parameter range for the imaging parameter includes using the acquired adjustment parameter to determine a first loading parameter, which would be produced by execution of the magnetic resonance sequence, and comparing the determined loading parameter with the limit value for the loading parameter. Determining the loading parameter produced by the magnetic resonance sequence can include determining a value of the loading parameter that occurs during execution of the magnetic resonance sequence. The value of the loading parameter is determined using the adjustment parameter. Thus the comparison of the determined loading parameter with the limit value for the loading parameter can be checking whether the value of the loading parameter exceeds the limit value for the loading parameter. A number of values of the loading parameter are determined on the basis of a number of parameter values of the imaging parameter. The parameter range for the imaging parameter then includes in particular those parameter values of the imaging parameter for which the associated determined value of the loading parameter does not exceed the limit value of the loading parameter. Thus an analysis can be made as to which parameter values of the imaging parameter can be used without exceeding the limit value for the loading parameter during the magnetic resonance imaging. In this analysis, the parameter values can be determined successively, for instance, by a binary search. Preferably, outer parameter ranges of the imaging parameter, for example, are tested by taking into account the adjustment parameter, because it is most likely for the limit value for the loading parameter to be exceeded in these outer ranges. The determined parameter values can then form the parameter range for the imaging parameter, which is used to adapt the first planning environment.

In another embodiment, determining the first loading parameter, which is produced by the magnetic resonance sequence, includes multiplying a partial loading parameter for one cycle of the magnetic resonance sequence, which partial loading parameter is calculated from the acquired adjustment parameter, by a number of cycles (repetitions) of the magnetic resonance sequence. This procedure is based on the consideration that the same partial loading parameter is produced for each cycle of the magnetic resonance sequence. A cycle of the magnetic resonance sequence can be formed here by a repeating pattern in the magnetic resonance sequence, for example one or more repetition intervals of the magnetic resonance sequence. Knowledge about a pattern or progression of the magnetic resonance sequence can be applied by the procedure in this embodiment in order to accelerate determination of the loading parameter, which is produced by the magnetic resonance sequence. This can be useful particularly when a number of values of the loading parameter are meant to be determined from a number of parameter values for the imaging parameter in order to define the parameter range for the imaging parameter, inside which range compliance with the limit value for the loading parameter can be achieved during the magnetic resonance imaging.

In another embodiment, determining the loading parameter, which is produced by the magnetic resonance sequence, includes a virtual roll-out of the diagnostic magnetic resonance sequence using the acquired adjustment parameter. The virtual roll-out of the diagnostic magnetic resonance sequence can include simulating the diagnostic magnetic resonance sequence. It may suffice for only a representative portion of the diagnostic magnetic resonance sequence, for instance a repetition interval, to be rolled out virtually, in order to save processing time. It is then possible to extrapolate the loading parameter from the virtual roll-out of the representative portion of the magnetic resonance sequence, which is produced by execution of the entire magnetic resonance sequence. The virtual roll-out of the magnetic resonance sequence can be a simulation, in particular an abstracted simulation, of the magnetic resonance sequence using the adjustment parameter. The virtual roll-out of the magnetic resonance sequence can include simulating a time waveform of gradient switching operations and/or RF pulses of the magnetic resonance sequence using the adjustment parameter. For this purpose, the virtual roll-out can include plotting an amplitude waveform of the gradient switching operations and/or RF pulses over the time period of the magnetic resonance sequence, which amplitude waveform is obtained using the adjustment parameter. The switching operations and/or RF pulses can be presented during the virtual roll-out as they would actually ultimately be implemented by hardware of the diagnostic magnetic resonance imaging device during the magnetic resonance imaging. The virtual roll-out of the magnetic resonance sequence can allow the loading parameter to be determined particularly accurately and in a way that is adapted to the actual circumstances.

In an embodiment, the aforementioned adjustment parameter is a first adjustment parameter, the aforementioned parameter range is a first parameter range, the aforementioned planning environment is a first planning environment, and the method includes the following further method steps.

Settings for the selected diagnostic magnetic resonance sequence modified by a user based on the provided first planning environment, so a modified diagnostic magnetic resonance sequence is generated in the control computer.

A second adjustment parameter for the modified magnetic resonance sequence is acquired in the control computer.

A second parameter range for the imaging parameter is determined in the control computer on the basis of the second adjustment parameter and the specified limit value for the loading parameter.

A second planning environment for the magnetic resonance imaging of the subject under examination is provided by the control computer at the user interface, which only the second parameter range can be set for the imaging parameter.

The method steps in this embodiment take place after the first planning environment is provided for the magnetic resonance imaging. The first planning environment provided according to the method of the invention is thus used to modify the settings for the selected magnetic resonance sequence. The actual magnetic resonance sequence typically stays the same in the modification; a configuration of the magnetic resonance sequence is adapted only when the magnetic resonance sequence is modified.

This embodiment involves modifying settings for the magnetic resonance sequence other than the imaging parameter. The imaging parameter can actually be set only within the parameter range in the first planning environment. The settings for the magnetic resonance sequence are modified in a way that requires a new adjustment parameter to be acquired. Modifying the settings, for example, involves changing a field of view for the magnetic resonance imaging, with the adjustment parameter no longer being valid for the modified field of view.

Modifying the settings for the magnetic resonance sequence thus can result in the parameter range no longer being optimally designed for the setting for the imaging parameter, in particular with regard to the limit value for the loading parameter. Thus, it may be that the modified magnetic resonance sequence allows an enlargement of the parameter range for the imaging parameter with regard to the limit value for the loading parameter. Alternatively, the modified magnetic resonance sequence may require a contraction of the parameter range for the imaging parameter in order to be able to comply with the limit value for the loading parameter during the magnetic resonance imaging.

Thus the second adjustment parameter is acquired, preferably automatically, after the magnetic resonance sequence is modified. The second adjustment parameter is specific to the subject under examination and to the modified magnetic resonance sequence. Thus the second adjustment parameter is adapted, for example, to a modified field of view for the magnetic resonance imaging. The second adjustment parameter is similar to the adjustment parameter, i.e. the same adjustment parameter is re-acquired. Thus the second adjustment parameter can be acquired in the same manner as the adjustment parameter. Hence the acquisition of the second adjustment parameter can constitute a repetition of the acquisition of the adjustment parameter. The second adjustment parameter may be a different value for the adjustment parameter from the adjustment parameter because the magnetic resonance sequence has been modified of course.

The second parameter range for the imaging parameter can be re-determined from the second adjustment parameter as already described for the parameter range. As mentioned, the second parameter range may be reduced or enlarged compared with the parameter range. It may also be the case that modifying the magnetic resonance sequence does not produce any change to the parameter range for the imaging parameter.

The second planning environment differs from the first planning environment merely in terms of the configurable parameter range for the imaging parameter. The second planning environment is similar in embodiment to the first planning environment except for the configurable parameter range for the imaging parameter. The second planning environment thus allows the user to set the imaging parameter such that it matches particularly advantageously the modified magnetic resonance sequence.

It is possible for the steps of this embodiment to be repeated if the magnetic resonance sequence is modified again by the user. The configurable parameter range for the imaging parameter can hence be dynamically adapted to modifications of the magnetic resonance sequence by the user.

In an embodiment, modifying the settings of the selected magnetic resonance sequence includes changing a geometry of a field of view of the magnetic resonance sequence. The field of view (FOV), also referred to as the region under examination, in particular constitutes a volume that is imaged in the captured magnetic resonance image data. The field of view is typically defined by a user on a localizer. The modified magnetic resonance sequence hence comprises in particular a second field of view, which is different in form from a first field of view of the original magnetic resonance sequence. Changing the geometry of the field of view can comprise the following, for instance: tilting or angulation of the slices of the field of view, changing the orientation of the field of view, changing a size of the field of view, changing a number of slices in the field of view, etc. Changing the geometry of the field of view can make it necessary in particular to re-acquire the adjustment parameter and hence to re-calculate the configurable parameter range.

In an embodiment, the second adjustment parameter is only acquired when the geometry of the field of view of the magnetic resonance sequence is changed by an amount greater than a specified limit value for the change in the geometry of the field of view. Thus the second adjustment parameter is not re-acquired every time the settings for the selected magnetic resonance sequence are modified. This approach is based on the consideration that in principle the second adjustment parameter must be re-acquired every time the field of view is modified. This can mean that for every modification to the field of view, there is a wait for the user until the second planning environment is provided. Just acquiring the second adjustment parameter can actually take several seconds. Restricting the acquisition of the second adjustment parameter to larger changes to the geometry of the field of view can thus increase the performance and make the planning environment easier to use.

In an embodiment, the adjustment measurement is performed in an adjustment measurement region that is larger than the field of view of the magnetic resonance sequence, wherein the limit value for the change in the geometry of the field of view is specified on the basis of dimensions of the adjustment measurement region. The second field of view, which exists after the modification to the magnetic resonance sequence, may hence be contained entirely within the adjustment measurement region. According to the proposed procedure, this may even be the case when the second field of view has been enlarged or moved with respect to the first field of view. By virtue of the adjustment measurement region being sufficiently large, the second adjustment parameter advantageously already exists in the modified field of view, with the result that the second parameter range for the imaging parameter can be determined without making another adjustment measurement. Hence changes to the field of view during modification of the settings for the selected magnetic resonance sequence, which changes lie within the generously sized adjustment measurement region, need not necessarily result in a repeat adjustment measurement. Thus acquiring the second adjustment parameter can be made considerably simpler and faster. The second planning environment can thereby also be provided considerably faster, hence increasing user-friendliness.

In another embodiment, the second adjustment parameter is acquired by a second adjustment measurement, which starts automatically and immediately in time after the settings for the magnetic resonance sequence are modified. The second adjustment measurement therefore starts without a time delay directly after modification of the settings for the magnetic resonance sequence. Modifying the settings for the magnetic resonance sequence can therefore initiate immediately the start of the second adjustment measurement. Starting the second adjustment measurement automatically can allow the second planning environment to be provided automatically.

Alternatively or additionally, the second adjustment measurement starts automatically, independently of any modification of the settings for the magnetic resonance sequence. Thus the second adjustment measurement can be performed in the background, even if it is not yet needed by alterations to the magnetic resonance sequence. The second adjustment measurement can also be performed prospectively by anticipating probable modifications to the selected magnetic resonance sequence, and by the automatically proceeding second adjustment measurement already taking these anticipated modifications into account. A database in which adjustment parameters specific to the subject under examination are stored, can hence be filled particularly advantageously.

In an embodiment, particularly at least five seconds elapse between an end of the adjustment measurement and a start of the second adjustment measurement. More preferably at least seven seconds elapse, more preferably at least nine seconds, most preferably at least ten seconds elapse between an end of the adjustment measurement and a start of the second adjustment measurement. A repetition rate of the adjustment measurements thus can be limited. Since the adjustment measurements and re-calculations of the parameter ranges for the imaging parameter can impair a performance of the planning environment, limiting the repetition rate of the adjustment measurement can increase the user-friendliness of the planning environment. Alternatively, the adjustment measurements can follow one another directly.

In an embodiment, the second adjustment measurement comprises a second transmit adjustment, which involves setting an RF voltage in an RF coil designed for transmission (radiation). In the transmit adjustment, a particularly advantageous second adjustment parameter can be determined for determining the second parameter range.

In another embodiment, the second adjustment measurement preferably requires a time of less than five seconds. The second adjustment measurement more preferably requires a time of less than four seconds, more preferably less than three seconds, and most preferably a maximum time of two seconds. The short duration of the second adjustment measurement is advantageous for reducing a possible time delay between modifying the magnetic resonance sequence, which in particular initiates the start of the second adjustment measurement, and providing and/or adapting the second planning environment on the basis of the second adjustment parameter acquired in the second adjustment measurement. This can increase user-friendliness. In addition, waiting times during planning of the magnetic resonance sequence can be reduced for the user.

In an embodiment, determining the second parameter range for the imaging parameter includes using the second adjustment parameter to determine a second loading parameter, which would be produced by execution of the modified magnetic resonance sequence, and comparing the second loading parameter with the limit value for the loading parameter. The second loading parameter, or specifically the second value of the loading parameter, can be acquired in the same manner as the first loading parameter, or specifically the value of the loading parameter. Thus the second parameter range can also be determined in a similar manner to determining the parameter range.

In another embodiment, determining the second loading parameter, which is produced by the modified magnetic resonance sequence, includes multiplying a second partial loading parameter for one cycle (repetition) of the modified magnetic resonance sequence, which partial loading parameter is calculated from the second adjustment parameter, by a number of cycles of the modified magnetic resonance sequence. This procedure can be performed as already described for the first loading parameter.

According to one embodiment, determining the second loading parameter, which is produced by the modified magnetic resonance sequence, includes a virtual roll-out of the modified magnetic resonance sequence using the second adjustment parameter. This procedure can be performed as already described for the first loading parameter.

In another embodiment, the adjustment parameter is stored in a database, the modification of the settings for the magnetic resonance sequence is reversed by the second planning environment, and the adjustment parameter is loaded from the database and replaces the second adjustment parameter so that there is no need to repeat an adjustment measurement. The database can be formed specifically for the subject under examination. Thus the adjustment parameter can be stored in the database specifically for the subject under examination. This approach can exploit the fact that the adjustment parameter has already been acquired. If now the original settings for the magnetic resonance sequence are restored when modifying the settings for the magnetic resonance sequence, the adjustment parameter can now be accessed again particularly advantageously. This can make a repeat adjustment measurement obsolete. This can also improve a performance of the planning environment, because it can dispense with waiting times for the user.

The magnetic resonance imaging device according to the invention has a control computer that is configured to operate the magnetic resonance imaging apparatus, including the scanner thereof, so as to perform the method according to the invention.

Thus the control computer is designed to execute computer-readable instructions in order to perform the method according to the invention. The magnetic resonance imaging device has a memory, wherein computer-readable information is stored, and the control computer is designed to load the computer-readable information from the memory and to execute the computer-readable information in order to perform the method according to the invention.

The control computer is designed to send control signals to the magnetic resonance scanner and/or to receive and/or to process control signals in order to perform the method according to the invention. The control computer can be integrated in the magnetic resonance imaging apparatus. The control computer can also be installed separately from the magnetic resonance scanner. The control computer can be connected to the magnetic resonance scanner.

The magnetic resonance imaging apparatus according to the invention is thus designed to perform a method for providing a planning environment for magnetic resonance imaging of a subject under examination. For this purpose, the control computer can have a selection unit, an acquisition unit, a specification unit and a determination unit. The selection unit is then designed to select a magnetic resonance sequence for the magnetic resonance imaging of the subject under examination. The acquisition unit is then designed to acquire for the selected magnetic resonance sequence, an adjustment parameter, which is specific to the subject under examination. The specification unit is then designed to specify a limit value for a loading parameter of the subject under examination. The determination unit is then designed to determine a parameter range for an imaging parameter of the magnetic resonance sequence on the basis of the acquired adjustment parameter and the specified limit value for the loading parameter. The provision unit is then designed to provide a planning environment for the magnetic resonance imaging of the subject under examination, in which only the determined parameter range can be set for the imaging parameter.

The components of the control computer of the magnetic resonance imaging apparatus according to the invention can largely be embodied in the form of software components. In principle, however, some of these components can be implemented in the form of software-supported hardware components, for instance FPGAs or the like, in particular when especially fast calculations are needed. Likewise, the required interfaces can be designed as software interfaces, for instance if all that is involved is a transfer of data from other software components. They can also be designed as hardware-built interfaces driven by suitable software. Of course it is also possible that a number of the specified components are combined in the form of a single software component or software-aided hardware component.

The present invention also encompasses a non-transitory, computer-readable data storage medium encoded with programming instructions. The storage medium is loadable into a control computer of a magnetic resonance imaging apparatus, and the programming instructions then cause the control computer to operate the magnetic resonance imaging apparatus in order to implement any or all of the embodiments of the method described above in accordance with the invention.

Examples of electronically readable data storage media are a DVD, a magnetic tape, a hard disk or a USB stick.

The advantages of the magnetic resonance imaging apparatus according to the invention and of the storage medium according to the invention are essentially the same as the advantages of the method according to the invention, as presented in detail above. Features, advantages or alternative embodiments mentioned in connection with the method are applicable to the other aspects of the invention. The functional features of the method are embodied in the apparatus by corresponding physical modules, in particular by hardware modules.

BRIEF DESCRIPTION OF THE DRAWINGS

FIG. 4 is a flowchart of a third embodiment of the method according to the invention.

DESCRIPTION OF THE PREFERRED EMBODIMENTS

Figure 1:
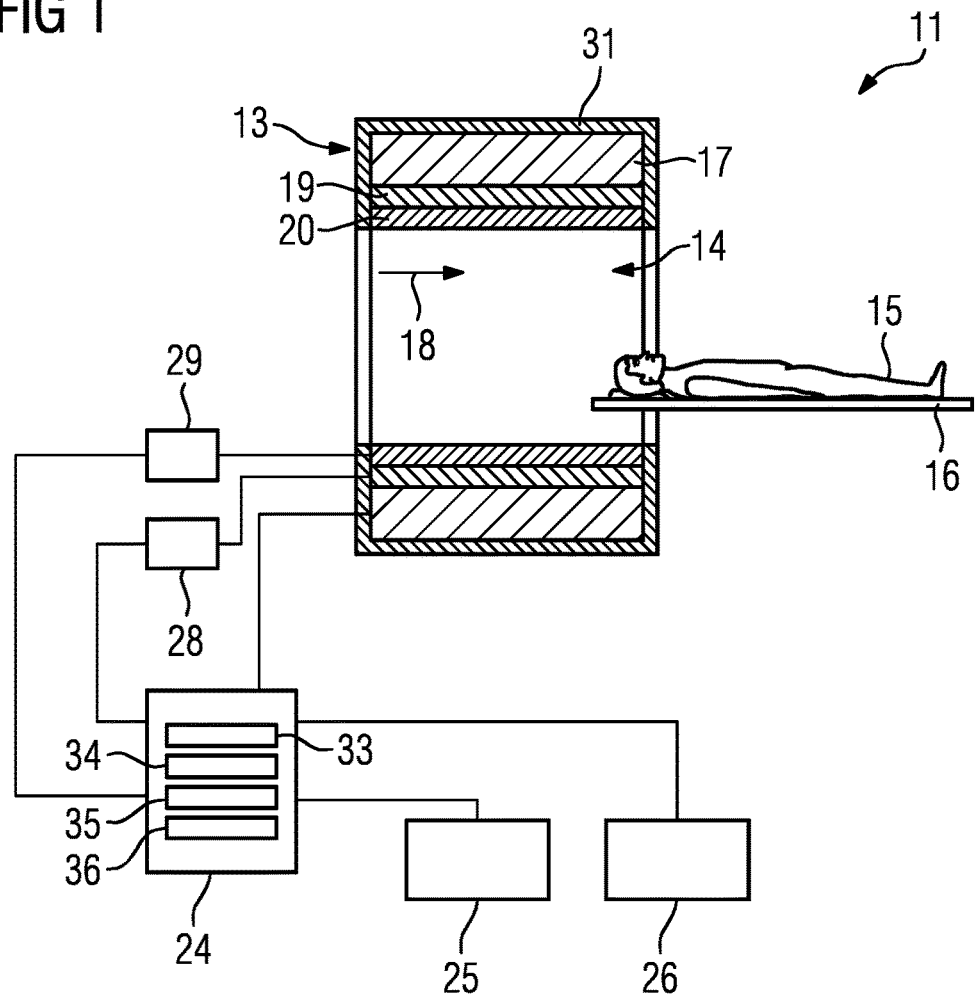
FIG. 1 schematically illustrates a magnetic resonance imaging apparatus according to the invention.

FIG. 1 shows schematically a magnetic resonance imaging apparatus 11 according to the invention. The magnetic resonance imaging apparatus 11 has a scanner 13 that contains a basic field magnet 17 that generates a strong and constant basic magnetic field 18. The scanner 13 has a cylindrical patient receiving zone 14 for receiving a subject 15 under examination, in the present case a patient. The patient receiving zone 14 is encompassed cylindrically in a circumferential direction by the scanner 13. The patient 15 can be moved into the patient receiving zone 14 by a patient support 16. The patient support 16 has a bed, which is movable within the scanner 13. A housing shell 31 screens the scanner 13 externally.

The scanner 13 further has a gradient coil arrangement 19 that generates magnetic field gradients, which are used for spatially encoding magnetic resonance signals during execution of the diagnostic sequence. The gradient coil arrangement 19 is controlled by a gradient controller 28. In addition, the scanner 13 has an RF antenna 20, which in the case shown is a body coil that is permanently integrated in the scanner 13, and an RF antenna controller 29 that operates the RF antenna 20 so as to radiate RF magnetic resonance sequences into an examination space, which is formed by the patient receiving zone 14. The RF magnetic resonance sequence excites certain nuclear spins in the subject 15, thereby giving those excited nuclear spins a magnetization that causes the excited nuclear spins to be deflected from the field lines of the basic magnetic field 18 by a predetermined amount known as a flip angle. As the excited nuclear spins relax and return to the steady state, they emit further RF signals, which are the aforementioned magnetic resonance signals. The RF antenna unit 20 is also designed to receive the magnetic resonance signals from the patient 15.

The magnetic resonance imaging apparatus 11 has a processor or control computer 24 for controlling the basic field magnet 17, the gradient controller 28 and the RF antenna controller 29. The control computer 24 centrally controls the magnetic resonance imaging apparatus 11, for instance implementing a predetermined imaging gradient echo sequence. Control data such as imaging parameters, and reconstructed magnetic resonance images, can be provided to a user on an output interface 25, in the present case on a display, of the magnetic resonance imaging apparatus 11. In addition, the magnetic resonance imaging apparatus 11 has an input unit 26, which can be used by a user to enter data and/or parameters during a measurement process. The control computer 24 can include the gradient controller 28 and/or the RF antenna controller 29 and/or the output interface 25 and/or the input unit 26.

In the shown embodiment, the control computer 24 has a selection processor 33, an acquisition processor 34, a specification processor 35, a determination processor 36.

Thus the magnetic resonance imaging apparatus 11, together with the output interface 25 and the control computer 24, is designed to perform the method according to the invention for providing a planning environment for magnetic resonance imaging of the subject is under examination.

The magnetic resonance imaging apparatus 11 shown can include further components that are typically present in magnetic resonance imaging apparatuses. Since those skilled in the art know how a magnetic resonance imaging apparatus 11 operates in general, a more detailed description of such operation is not necessary herein.

Figure 2:
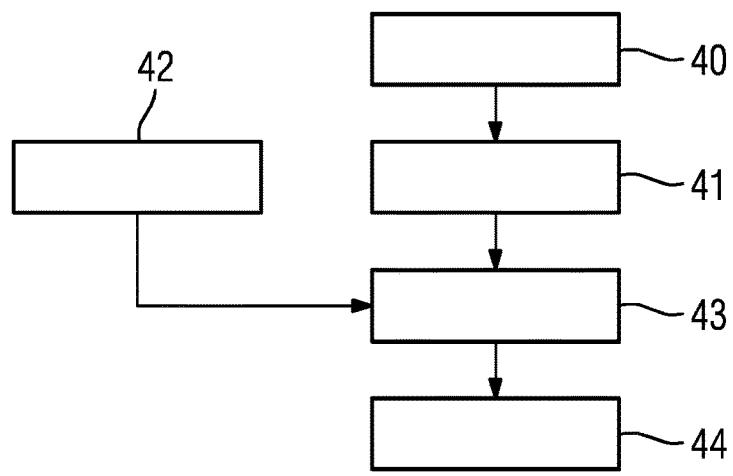
FIG. 2 is a flowchart of a first embodiment of the method according to the invention.

FIG. 2 is a flowchart of a first embodiment of the method according to the invention for providing a planning environment for magnetic resonance imaging of a subject is under examination using the magnetic resonance imaging apparatus 11.

In a first method step 40, the selection processor 33 selects a magnetic resonance sequence for the magnetic resonance imaging of the subject 15 under examination.

In a further method step 41, the acquisition processor 34 acquires, for the selected magnetic resonance sequence, an adjustment parameter, which is specific to the subject 15 under examination.

In a further method step 42, the specification processor 35 specifies a limit value for a loading parameter of the subject is under examination.

In a further method step 43, the determination processor 36 determines a parameter range for an imaging parameter of the magnetic resonance sequence on the basis of the acquired adjustment parameter and the specified limit value for the loading parameter.

In a further method step 44, the output interface 25 provides a planning environment for the magnetic resonance imaging of the subject 15 under examination, in the planning environment only the determined parameter range can be set for the imaging parameter.

Figure 3:
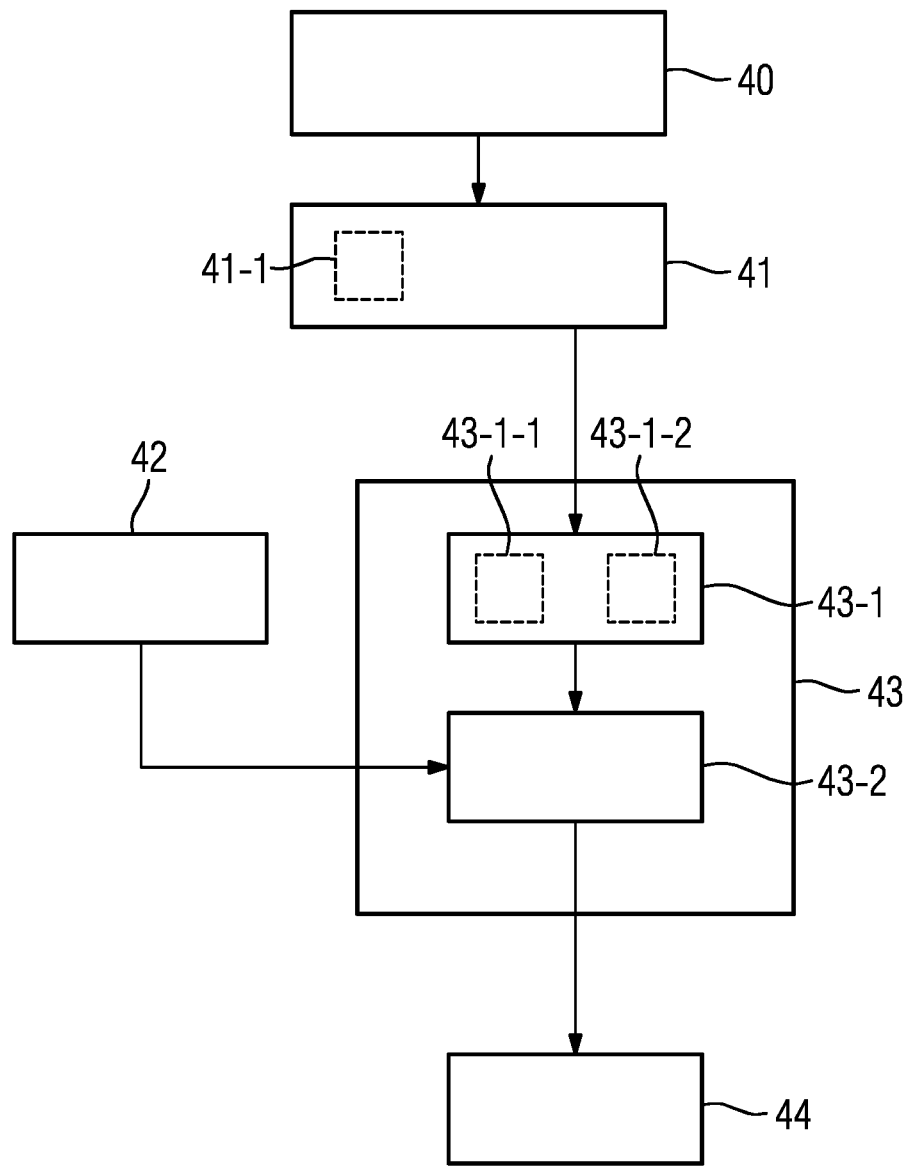
FIG. 3 is a flowchart of a second embodiment of the method according to the invention.

FIG. 3 is a flowchart of a second embodiment of the method according to the invention for providing a planning environment for magnetic resonance imaging of a subject 15 under examination using the magnetic resonance imaging apparatus 11.

The following description is confined largely to the differences with respect to the exemplary embodiment in FIG. 2, with reference being made to the description of the exemplary embodiment in FIG. 2 as regards unchanged method steps. Basically the same reference numbers are used to denote unchanged method steps.

The embodiment shown in FIG. 3 of the method according to the invention essentially includes the method steps 40, 41, 42, 43, 44 of the first embodiment of the method according to the invention shown in FIG. 2. The embodiment shown in FIG. 3 of the method according to the invention also comprises additional method steps and sub-steps. An alternative method sequence from FIG. 3 including only some of the additional method steps and/or sub-steps shown in FIG. 3 is also possible. Of course an alternative method sequence from FIG. 3 can also include additional method steps and/or sub-steps.

In a first sub-step 41-1 of the further method step 41, the adjustment parameter is acquired by an adjustment measurement, which starts automatically and immediately in time after the magnetic resonance sequence is selected. In this sub-step, the adjustment measurement is a transmit adjustment, which involves setting an RF voltage in an RF coil designed for transmission. The adjustment measurement preferably has a duration of less than five seconds.

In a first sub-step 43-1 of the further method step 43, determining the parameter range for the imaging parameter includes using the acquired adjustment parameter to determine a loading parameter, which would be produced by executing the magnetic resonance sequence. Two different options 43-1-1, 43-1-2 can be used here. According to the first option 43-1-1, determining the loading parameter, which is produced by the magnetic resonance sequence, includes multiplying a partial loading parameter for one cycle (repetition) of the magnetic resonance sequence, which partial loading parameter is calculated from the acquired adjustment parameter, by a number of cycles of the magnetic resonance sequence. According to the second option 43-1-2, determining the loading parameter, which is produced by the magnetic resonance sequence, includes a virtual roll-out of the magnetic resonance sequence using the acquired adjustment parameter. Finally, determining the parameter range for the imaging parameter includes in a second sub-step 43-2 of the further method step 43, comparing the determined first loading parameter with the limit value for the loading parameter.

FIG. 4 shows a flowchart of a third embodiment of the method according to the invention for providing a planning environment for magnetic resonance imaging of a subject 15 under examination using the magnetic resonance imaging apparatus 11.

The following description is confined largely to the differences with respect to the exemplary embodiment in FIG. 2, with reference being made to the description of the exemplary embodiment in FIG. 2 as regards unchanged method steps. Basically the same reference numbers are used to denote unchanged method steps.

The embodiment shown in FIG. 4 of the method according to the invention essentially includes the method steps 40, 41, 42, 43, 44 of the first embodiment of the method according to the invention shown in FIG. 2. The embodiment shown in FIG. 4 of the method according to the invention also includes additional method steps and sub-steps. An alternative method sequence from FIG. 4 that includes only some of the additional method steps and/or sub-steps shown in FIG. 4 is also possible. Of course an alternative method sequence from FIG. 4 can also include additional method steps and/or sub-steps.

It should first be mentioned that the sub-step 41-1 of the further method step 41 and the sub-steps 43-1, 43-2 of the further method step 43 shown in FIG. 3 and described with reference thereto, can also be used in the method according to the invention shown in FIG. 4. The method according to the invention shown in FIG. 4 has additional method steps, which are performed later in time than the method steps shown in FIG. 2 or FIG. 3.

In a further method step 45, a user modifies settings for the selected magnetic resonance sequence by the provided first planning environment, wherein a modified magnetic resonance sequence is generated. In this case in a sub-step 45-1 of the further method step 45, modifying the settings for the selected magnetic resonance sequence can comprise changing a geometry of a field of view of the magnetic resonance sequence.

In a further method step 46, a second adjustment parameter is acquired for the modified magnetic resonance sequence. The second adjustment parameter is acquired in a sub-step 46-1 of the further method step 46 by a second adjustment measurement, which starts automatically and immediately in time after the settings for the magnetic resonance sequence are modified. The second adjustment measurement comprises in particular a second transmit adjustment, which involves setting an RF voltage in an RF coil designed for transmission. In addition, the second adjustment measurement preferably has a duration of less than five seconds. Particularly advantageously, at least five seconds elapse between an end of the first adjustment measurement and a start of the second adjustment measurement.

It is advantageous that the second adjustment parameter is acquired only when the geometry of the field of view of the magnetic resonance sequence is changed by an amount greater than a specified limit value for the change in the geometry of the field of view. This can be checked in a checking step 45X. The first adjustment measurement is advantageously performed in an adjustment measurement region that is larger than the field of view of the magnetic resonance sequence, wherein the limit value for the change in the geometry of the field of view is specified on the basis of dimensions of the adjustment measurement region.

In a further method step 47, a second parameter range for the imaging parameter is determined on the basis of the second adjustment parameter and the specified limit value for the loading parameter. In a first sub-step 47-1 of the further method step 47, determining the second parameter range for the imaging parameter comprises using the second adjustment parameter to determine a second loading parameter, which would be produced by executing the modified magnetic resonance sequence. Again two options 47-1-1, 47-1-2 are possible here. According to the first option 47-1-1, determining the second loading parameter, which is produced by the modified magnetic resonance sequence, includes multiplying a second partial loading parameter for one cycle (repetition) of the magnetic resonance sequence, which partial loading parameter is calculated from the second adjustment parameter, by a number of cycles of the modified magnetic resonance sequence. According to the second option 47-1-2, determining the second loading parameter, which is produced by the modified magnetic resonance sequence, includes a virtual roll-out of the modified magnetic resonance sequence using the second adjustment parameter. Finally, in a second sub-step 47-2 of the further method step 47, determining the second parameter range for the imaging parameter includes comparing the second loading parameter with the limit value for the loading parameter.

In a further method step 48, a second planning environment is provided for the magnetic resonance imaging of the subject under examination, wherein in the second planning environment only the second parameter range can be set for the imaging parameter.

The method according to the invention can be extended such that in a further method step 49, the first adjustment parameter is stored in a database. In a further method step 50, the modification to the settings for the magnetic resonance sequence is reversed by the second planning environment. Then in a further method step 51, the first adjustment parameter can be loaded from the database and can replace the second adjustment parameter, so that there is no need to repeat an adjustment measurement.

The method steps shown in FIGS. 2 to 4 of the method according to the invention are performed by the control computer 24. For this purpose, the control computer has the necessary software and/or computer programs, which are stored in a memory unit of the control computer. The software and/or computer programs comprise program means that are designed to perform the method according to the invention when the computer program and/or software is executed in the control computer 24 by a processor.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for presenting a planning environment for magnetic resonance (MR) imaging of a subject under examination by operation of an MR imaging apparatus, said method comprising:
   providing an electronic input into a computer that selects an MR sequence for said MR imaging of the subject with said MR apparatus, the MR sequence comprising a plurality of repetitions of a cycle of the MR sequence;
   in said computer, for the selected MR sequence, acquiring an adjustment parameter that is specific to the subject;
   in said computer, specifying a limit value for a loading parameter of the subject;
   in said computer, determining a parameter range for an imaging parameter of the selected MR sequence using said adjustment parameter and said specified limit value for the loading parameter to determine the loading parameter of the subject by multiplying a loading parameter for one of the cycles by a number of the cycles in the MR sequence, the loading parameter being produced by executing said MR sequence, and comparing the loading parameter in the computer with the limit value for the loading parameter; and
   at a user interface in communication with said computer, presenting a planning environment for the MR imaging of the subject, in which only the determined parameter range can be set for the imaging parameter.

2. A method as claimed in claim 1 comprising acquiring said adjustment parameter by operating said MR imaging apparatus to execute an adjustment measurement starting automatically and immediately after selecting said MR sequence.

3. A method as claimed in claim 2 wherein said adjustment measurement includes a transmit adjustment comprising setting a radio-frequency (RF) voltage of an RF coil in said MR imaging apparatus that radiates RF energy into the subject under examination.

4. A method as claimed in claim 2 comprising implementing said adjustment measurement with a duration of less than five seconds.

5. The method of claim 1, wherein the adjustment parameter is an estimate of the loading parameter expected for the MR imaging of the subject under examination using the selected MR sequence.

6. A magnetic resonance (MR) apparatus comprising:
   an MR data acquisition scanner
   a computer that receives an electronic input into a computer that selects an MR sequence for MR imaging of a subject with said MR data acquisition scanner, the MR sequence comprising a plurality of repetitions of a cycle of the MR sequence;
   said computer being configured to acquire, for the selected MR sequence, an adjustment parameter that is specific to the subject;
   said computer being configured to specify a limit value for a loading parameter of the subject;
   said computer being configured to determine a parameter range for an imaging parameter of the selected MR sequence using said adjustment parameter and said specified limit value for the loading parameter to determine the loading parameter of the subject by multiplying a loading parameter for one of the cycles by a number of the cycles in the MR sequence, the loading parameter being produced by executing said MR sequence, and comparing the loading parameter in the computer with the limit value for the loading parameter; and
   a user interface in communication with said computer, said computer being configured to present a planning environment at said user interface for the MR imaging of the subject, in which only the determined parameter range can be set for the imaging parameter.

7. A non-transitory, computer-readable data storage medium encoded with programming instructions, said storage medium being loaded into a computer of a magnetic resonance (MR) apparatus, and said programming instructions causing said computer to:
   receive an electronic input that selects an MR sequence for MR imaging of a subject with said MR apparatus, the MR sequence comprising a plurality of repetitions of a cycle of the MR sequence;
   for the selected MR sequence, acquire an adjustment parameter that is specific to the subject under examination;
   specify a limit value for a loading parameter of the subject under examination;
   determine a parameter range for an imaging parameter of the selected MR sequence based using adjustment parameter and said specified limit value for the loading parameter to determine the loading parameter of the subject by multiplying a loading parameter for one of the cycles by a number of the cycles in the MR sequence, the loading parameter being produced by executing said MR sequence, and comparing the loading parameter in the computer with the limit value for the loading parameter; and
   at a user interface in communication with said computer, present a planning environment for the MR imaging of the subject under examination, in which only the determined parameter range can be set for the imaging parameter.

8. A method for presenting a planning environment for magnetic resonance (MR) imaging of a subject under examination by operation of an MR imaging apparatus, the method comprising:
   providing an electronic input into a computer that selects an MR sequence for the MR imaging of the subject with the MR apparatus;
   in the computer, for the selected MR sequence, acquiring an adjustment parameter that is specific to the subject;
   in the computer, specifying a limit value for a loading parameter of the subject;
   in the computer, determining a parameter range for an imaging parameter of the selected MR sequence using the adjustment parameter and the specified limit value for the loading parameter to determine the loading parameter of the subject by executing a virtual roll-out of the MR sequence using the first adjustment parameter, the loading parameter being produced by executing the MR sequence, and comparing the loading parameter in the computer with the limit value for the loading parameter; and
   at a user interface in communication with the computer, presenting a planning environment for the MR imaging of the subject, in which only the determined parameter range can be set for the imaging parameter.

9. A method for presenting a planning environment for magnetic resonance (MR) imaging of a subject under examination by operation of an MR imaging apparatus, said method comprising:
provobviding an electronic input into a computer that selects an MR sequence for said MR imaging of the subject with said MR apparatus;
in said computer, for the selected MR sequence, acquiring an adjustment parameter that is specific to the subject;
in said computer, specifying a limit value for a loading parameter of the subject;
in said computer, determining a parameter range for an imaging parameter of the selected MR sequence based on said adjustment parameter and said specified limit value for the loading parameter;
at a user interface in communication with said computer, presenting a planning environment for the MR imaging of the subject, in which only the determined parameter range can be set for the imaging parameter, wherein said determined parameter range is a first parameter range, said adjustment parameter is a first adjustment parameter, and said planning environment is a first planning environment; and
at said user interface, receiving user-modified settings for said selected magnetic resonance sequence presented in said first planning environment, thereby generating a modified MR sequence;
in said computer, acquiring, for said modified MR sequence, a second adjustment parameter;
in said computer, determining a second parameter range for said imaging parameter based on said second adjustment parameter and the specified limit value for the loading parameter; and
at said user interface, presenting a second planning environment for said MR imaging of the subject, in which only the second parameter range can be set for said imaging parameter.

10. A method as claimed in claim 9 comprising modifying said settings of said selected MR sequence by changing a geometry of a field of view of said MR sequence.

11. A method as claimed in claim 10 comprising acquiring said second adjustment parameter only when the geometry of the field of view of the MR sequence is changed by an amount that is larger than a predetermined limit value for said change in the geometry of the field of view.

12. A method as claimed in claim 11 comprising:
acquiring said first adjustment parameter by operating said MR imaging apparatus to execute a first adjustment measurement that starts automatically and immediately after selection of said MR sequence;
performing said first adjustment measurement in an adjustment measurement region that is larger than said field of view of said MR sequence; and
specifying said predetermined limit value for said change in the geometry of the field of view based on dimensions of the adjustment measurement region.

13. A method as claimed in claim 12 comprising acquiring said second adjustment parameter by a second adjustment measurement starting automatically and immediately after modifying the settings for the selected MR sequence.

14. A method as claimed in claim 13 comprising allowing at least five seconds to elapse between an end of said first adjustment measurement and a start of said second adjustment measurement.

15. A method as claimed in claim 13 wherein said second adjustment measurement comprises making a transmit adjustment comprising setting a radio-frequency (RF) voltage of an RF coil in said MR imaging apparatus that radiates RF energy into said subject under examination.

16. A method as claimed in claim 15 comprising implementing said second adjustment measurement with a duration of less than five seconds.

17. A method as claimed in claim 9 comprising determining said second parameter range for said imaging parameter using said second adjustment parameter to determine a loading parameter, which would be produced by said modified magnetic resonance sequence, and comparing said loading parameter with said limit value for said loading parameter.

18. A method as claimed in claim 17 wherein said modified MR sequence comprises a plurality of repetitions of a cycle of said modified MR sequence, and comprising determining said loading parameter by multiplying a loading sequence for said cycle by a number of said cycles in said modified MR sequence.

19. A method as claimed in claim 17 comprising determining said loading parameter by implementing, in said computer, a virtual roll-out of said modified MR sequence using said second adjustment parameter.

20. A method as claimed in claim 9 comprising:
storing said first adjustment parameter in a database accessible by said computer;
modifying the setting of the MR sequence presented in said second planning environment; and
loading said first adjustment parameter from said database so as to replace said second adjustment parameter, without repetition of an adjustment measurement.

* * * * *